(12) United States Patent
Schaffer (10) Patent No.: US 7,551,180 B2
(45) Date of Patent: Jun. 23, 2009

(54) GRAPHICAL END CONDITIONS FOR ROADWAY DESIGN

(75) Inventor: Denis J. Schaffer, Huntsville, AL (US)

(73) Assignee: Bentley System, Inc., Exton, PA (US)

( * ) Notice: Subject to any disclaimer, the term of this patent is extended or adjusted under 35 U.S.C. 154(b) by 1043 days.

(21) Appl. No.: 10/803,031

(22) Filed: Mar. 18, 2004

(65) Prior Publication Data

US 2005/0210386 A1    Sep. 22, 2005

(51) Int. Cl.
*G06T 15/00* (2006.01)
(52) U.S. Cl. .................. 345/619; 345/419; 345/620
(58) Field of Classification Search ................. 345/419, 345/420, 619, 620
See application file for complete search history.

(56) References Cited

U.S. PATENT DOCUMENTS 5,799,403 A * 9/1998 Schrum ................ 33/290
6,996,507 B1 * 2/2006 Myr ..................... 703/2
2003/0193499 A1 * 10/2003 Gao ..................... 345/420

OTHER PUBLICATIONS

Lee et al., System Dynamic Approach for Error and Change management in Concurrent Design and Construction, Procedure of 2005 Winter Simulation conference, Dec. 2005, pp. 1508-1514.*

* cited by examiner

*Primary Examiner*—Phu K Nguyen
(74) *Attorney, Agent, or Firm*—Venable LLP; James R. Burdett; Jeffri A. Kaminski (57) ABSTRACT

A system and method for graphically designing and testing end conditions is provided. The method and system allow for easy visualization and reuse of end condition components. A simple drag and drop methodology may be provided to allow for quick creation of end condition combinations. A user can create various different design scenarios. The system and method may determine which of those design scenarios is valid based on existing conditions. The testing environment may read the proposed end condition combination to determine targets. Various targets can be moved and placed in the testing environment in order to determine if the end condition combination is valid or not.

17 Claims, 6 Drawing Sheets

GRAPHICAL END CONDITIONS FOR ROADWAY DESIGN

BACKGROUND OF THE INVENTION

1. Field of the Invention

The present invention relates to a system and method for fitting a new design with existing conditions.

2. Related Art

CAD software is well-known, and used by architects, engineers, designers, planners, and the like to create precision models and technical illustrations. It is used to create two-dimensional (2-D) drawings, maps, and three-dimensional (3-D) models. CAD software may be used to design roadways, highways and the like. Applications such as MicroStation® products, which are developed by Bentley Systems, Inc., Exton, Pa. U.S.A., and AutoCAD® products, which are developed by Autodesk, Inc., San Rafael, Calif., U.S.A., are typical of such CAD software, which may be used in the engineering, construction, and operations (ECO) marketplace.

CAD software, such as InRoads®, one of the MicroStation® products from Bentley Systems, provides a graphic environment to create a three-dimension digital surface such as a roadway. InRoads® provides functionality that allows a user to define roadway conditions, generate cross-sections and three-dimensional models, calculate volumes, generate reports, evaluate the design, and create plan and profile sheets. These extensive features, along with additional application add-in tools, make designing a complex highway system or simply laying out a small subdivision an interactive and easy process.

Typically the surface of a road is defined using cross sections, or templates. A template defines the cross section of a road at a single point. However, templates define an entire roadway surface when they are applied successively along an alignment. Placing one or more templates repeatedly along a path defined by horizontal and vertical alignments generates a three-dimensional corridor model. The distance between each application of the template is determined by an interval parameter. The smaller the interval, the more accurate the model.

Part of the design process is to fit the new design into existing conditions. This may be done using end conditions. End conditions define the connection of a point in the design to a target. In roadway design, end conditions usually connect the new roadway design with the existing ground, for example, via a side slope extending from the roadway surface. The end conditions may be line segments that are projected transverse from an edge of a typical section, and seek an intersection with a target, usually the existing ground. The segments are combined in sequences which are considered to be successful if they hit the target. Multiple design scenarios may be checked at each location at which a typical section is placed along a design. A designer does not need to manually create the design at each point.

Figures 1, 8:
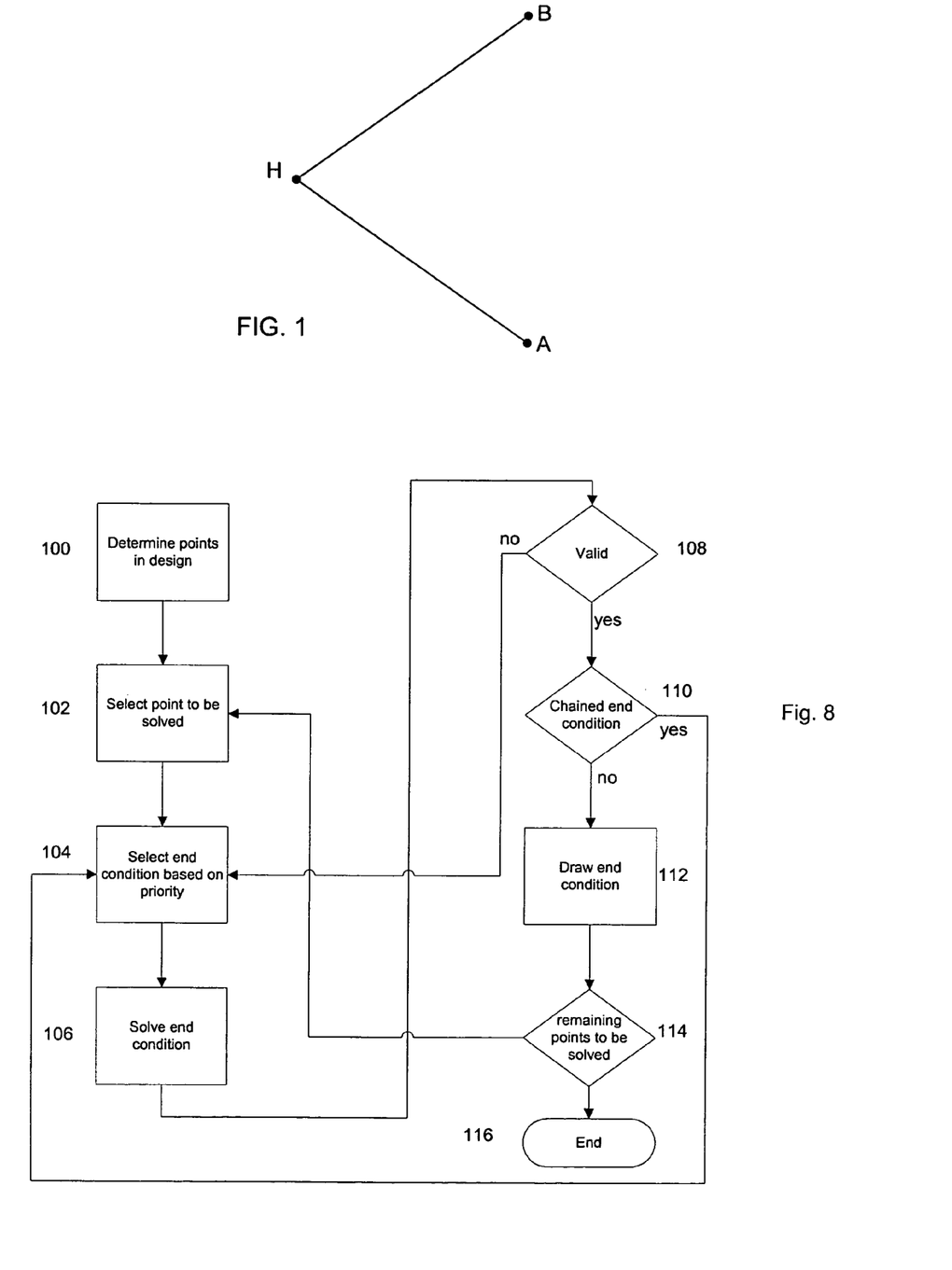
FIG. 1 depicts an example of end conditions.
FIG. 8 depicts a flow diagram for a method according to an exemplary embodiment of the present invention.

FIG. 1 illustrates an example of end conditions in roadway design. The edge of the roadway is defined as point H. Depending on the location of the existing ground at this location, it may be desired to have a side slope extend from the edge of the roadway with a negative slope to point A or a positive slope to point B. End conditions can be used to define the applicable design. A decision table, shown below, may be used to define the end conditions. Decision tables follow along a linear path (such as the edge of the road or a graphic element) and define transverse geometry at predefined intervals along that path. The transverse geometry is defined using line segments that extend perpendicular from a linear control. The line segments are connected end-to-end to represent a cross section of the design.

A decision table is a sequential list of segments. A record contains names for the start point and the end point, a slope, and a width that defines each segment. The purpose of listing segments is that one of them should produce an intersection (usually with the existing ground). If a segment does not produce an intersection, the table moves on to the next segment. When a segment does produce a final intersection, the table stops.

The example shown in FIG. 1 presents a very simple decision table. The decision table defines just two segments: one for cut side slopes and one for fill slopes. The following list represents the decision table:

| Start | End | Slope | Width |
|-------|-----|-------|-------|
| H     | A   | −0.35 | 1,000 m |
| H     | B   | 0.35  | 1,000 m |

This decision table contains two records. Each record defines a segment. Referring to FIG. 1, the first record defines segment HA, which extends from the point H for 1,000 meters of width, sloping downward at 35% grade. If this slope does not intersect the ground, the next segment in the table is attempted. The second segment HB also extends from point H for 1,000 meters, but is sloping up at 35% grade.

Decision tables and other text-based tools have a disadvantage of being difficult to visualize. This is particularly true when a designer is dealing with a complex series of tables. This results in the designer having to go deep into the design process just to test the validity of the decision tables or other text-based tool being used. Thus, there is a need for a simple process for handling end conditions.

SUMMARY OF THE INVENTION

In an exemplary embodiment of the invention, a method comprising graphically displaying at least one end condition; determining a target type of the end condition; determining a location of the target; and determining when the end condition is valid is provided.

Further objectives and advantages, as well as the structure and function of preferred embodiments will become apparent from a consideration of the description, drawings, and examples.

BRIEF DESCRIPTION OF THE DRAWINGS

The foregoing and other features and advantages of the invention will be apparent from the following, more particular description of a preferred embodiment of the invention, as illustrated in the accompanying drawings wherein like reference numbers generally indicate identical, functionally similar, and/or structurally similar elements.

DETAILED DESCRIPTION OF THE INVENTION

Embodiments of the invention are discussed in detail below. In describing embodiments, specific terminology is employed for the sake of clarity. However, the invention is not intended to be limited to the specific terminology so selected. While specific exemplary embodiments are discussed, it should be understood that this is done for illustration purposes only. A person skilled in the relevant art will recognize that other components and configurations can be used without parting from the spirit and scope of the invention.

In an exemplary embodiment of the present invention, a system and method for graphically designing and testing end conditions is provided. The method and system allow for easy visualization and reuse of end condition components. A simple drag and drop methodology may be provided to allow for quick creation of end condition combinations. A user can create various different design scenarios. The system and method may determine which of those design scenarios is valid based on existing conditions. The testing environment may read the proposed end condition combination to determine targets. Various targets can be moved and placed in the testing environment in order to determine if the end condition combination is valid or not.

For example, a user may create a new roadway design. Using end conditions, the user can create different ways in which the design is fit into the various existing conditions at the proposed roadway location. The designs may be tested based on different existing conditions to visually indicate to the designer which design is applicable when those existing conditions are present.

Figure 2:
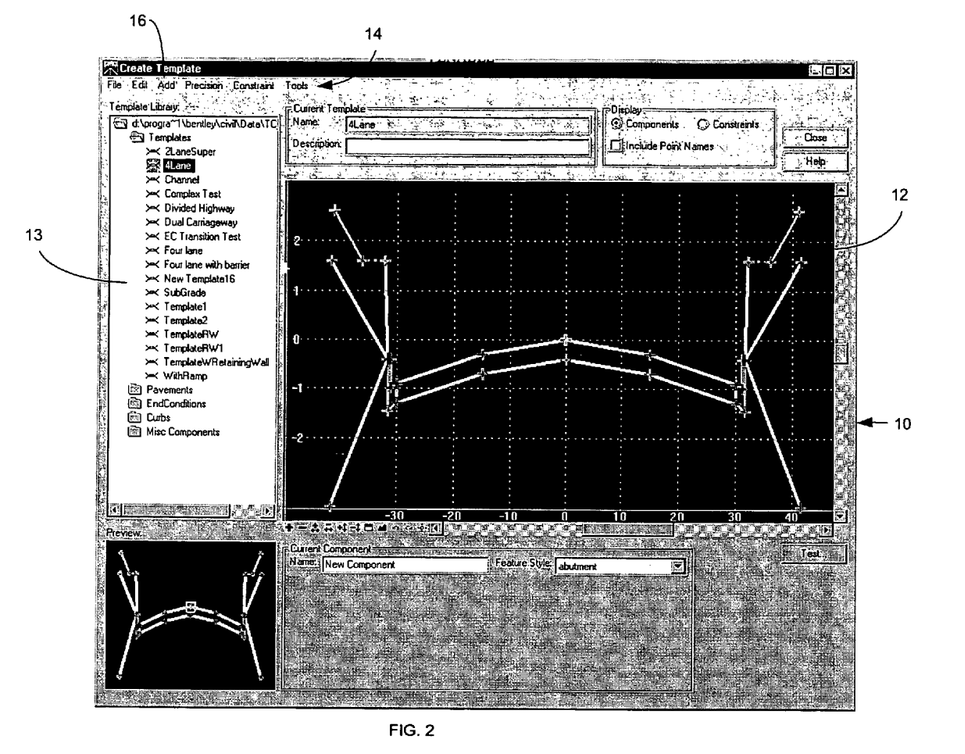
FIG. 2 depicts a graphical user interface for managing end conditions according to an exemplary embodiment of the present invention.
Figure 3:
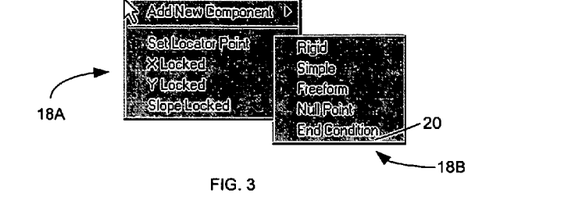
FIG. 3 depicts a graphical user interface for adding end conditions according to an exemplary embodiment of the present invention.

FIG. 2 illustrates an example of a graphical user interface (GUI) 10 according to an exemplary embodiment of the present invention. The GUI 10 includes, among other things, a graphics portion 12. The graphics portion 12 displays the current design. Here, a roadway is being designed and the graphics portion 12 displays a cross section of the roadway design at a selected point. GUI 10 may also include a text portion 13 in which a directory or other information may be displayed. The GUI 10 also presents various buttons and menu items that allow a user to create their design. The user can create and test end conditions via the GUI 10. A menu bar 14 is provided at a top portion of the GUI 10. The menu bar 14 includes, among other things, an add option 16. The add option 16 is used to add components to the design. Selecting the add option 16 via an input device, such as a computer mouse, causes a drop down menu to be displayed. An example of a drop down menu 18A, B is shown in FIG. 3. Menu 18B displays the various types of components that may be added to the design. The components may include rigid, simple, freeform, null point, and end condition components. The user selects the end condition option 20 from the menu 18B in order to add a new end condition.

Figure 4:
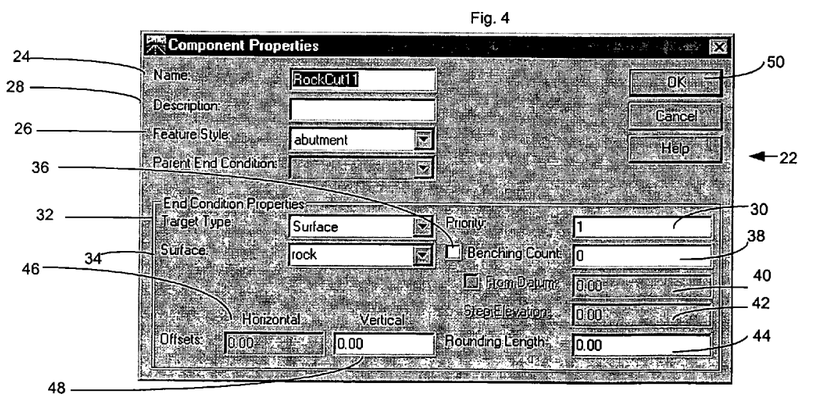
FIG. 4 depicts a graphical user interface for defining end conditions according to an exemplary embodiment of the present invention.

The user may be able to define the properties of the end condition. In this example, the properties of the end condition may be defined before the end condition is added to the design. A GUI may be presented to the user in order to create the end condition and define its properties. An example of such a GUI 22 is shown in FIG. 4. The GUI 22 is used to define the end condition and its properties. The properties of the end condition are used during testing or modeling in order to determine if the end condition is valid or not. Various fields, checkboxes, etc. may be provided for the user to define the properties of the end condition. The GUI 22 includes fields for the user to enter a name 24, feature style 26, and description 28 for the end condition. The name and description of the end condition may be defined by the user based upon naming conventions and drafting standards. The feature style defines what type of feature the end condition defines, for example, an abutment, ditch, berm, etc. The priority 30 of an end condition indicates the order in which the end conditions are applied. The lower the priority number, the higher the priority. The use of priority is described in more detail below in connection with solving and testing multiple end conditions.

The target type 32 and surface properties are used to specify a particular target to seek in order to solve the end condition. An end condition is solved when it intersects its target. Many different types of targets may be specified depending on what is being designed. In roadway design, typical target types may include surface, material, elevation, feature XY, feature Z, feature XYZ, alignment XY, alignment Z, and alignment XYZ. The design and existing roadway conditions are searched to determine if that target is present. It is then determined if the end condition intersects the target in order to solve the end condition. For the surface target type, the surface that has the name specified by the surface identified in field 34 is searched for. If no surface is specified, the active surface is searched for. The material target type causes a surface that has a material name that matches the material name entered in field 34 to be searched for. In that case, field 34 is labeled "material." The elevation target type determines if the end condition intersects the specified elevation.

For any of the "feature" target types, field 34 may be divied into two sub-fields (not shown). The sub-fields allow a user to enter a surface name and a feature name for the target type. For the feature XY target type, the end condition is valid if it intersects a vertical plane defined by the offset of the surface feature specified in field 34. For the feature Z target type, the end condition is tested to determine if it intersects the elevation of the offset of the surface feature specified in field 34. For the feature XYZ target type, the end condition component is drawn to the surface feature specified in field 34.

Alignment XY is similar to feature XY except that a horizontal alignment may be specified in field 34. Alignment Z is similar to feature Z except that horizontal and vertical alignments may be specified in field 34. Alignment XYZ is similar to feature XYZ except that a horizontal and vertical alignments may be specified in field 34. Various examples of solutions for different target types are given below and will serve to further explain some of the different types of targets.

GUI 22 may also be used to define benching. Benching is the placement of short, usually nearly horizontal segments at regular intervals along a side slope. Checkbox 36 is used to indicate whether or not benching is being used. Field 38 is provided for a benching count. The benching count is a number greater than zero that indicates the maximum number of benches to be used. If there are end conditions attached to the end of the component being created, these end conditions are attached after the last bench regardless of whether or not the bench is successful. If benching is used, then a value may be indicated for benching datum in field 40. The benching datum value is used as the absolute elevation from which step elevations are started. The benching step elevation 42 sets the distance between benches. For example, if the benching datum value 40 is set to 3 and the step elevation 42 is set to 10, then possible bench elevations include −17, −7, 3, 13, 23, . . . .

The rounding length 44 specifies a length that may be used to round the end condition. When a value other than zero is entered for the rounding length 44, additional points are added to the end of the end condition to smooth out the transition of the intersection of the end condition with its target. This rounding may be done using a parabolic formula. The rounding effect may only be applied when the target is a surface or an elevation. If another end condition is chained to the rounded end condition, the chained end condition is attached to the end of the rounded section. Chained end conditions are described in more detail below.

The horizontal and vertical offsets 46, 48 specify that the end condition is valid if it intersects a target at a location a certain offset to the side of or above or below the target, respectively.

Once the properties for the new end condition have been defined, via GUI 22, the user selects OK button 50. GUI 22 is then closed and the end condition may be placed in the design. This may be done in GUI 10 (FIG. 2) by moving a cursor in the display portion 12 to a desired location via an input device, such as a computer mouse. The left mouse button is pressed by the user to select the starting point for the end condition. Each subsequent point in the end condition is then placed by moving the cursor to the appropriate location and pressing the left mouse button. A line segment representing the end condition is then drawn connecting the points. The user can draw end conditions in this manner. Each time a new point is placed, the user may be prompted to enter the points end condition properties. An example of a GUI for this purpose is shown in FIG. 5.

Figure 5:
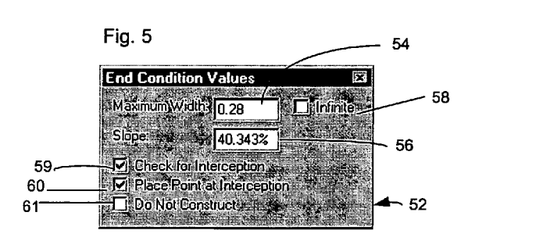
FIG. 5 depicts a graphical user interface for defining end conditions according to an exemplary embodiment of the present invention.

GUI 52 shown in FIG. 5 is an example of an end condition value dialogue box. Recall that an end condition is defined by a number of line segments each connecting two points. GUI 52 is used to define various properties of the line segment. The values that are set in the GUI 52 represent the last point placed, not the point that is about to be placed. GUI 52 includes field 54 for a maximum width/height. This value represents the maximum width/height of the line segment preceding the point. The slope 56 indicates the slope of the preceding line segment. A checkbox 58 is provided to indicate an infinite length for the line segment. Checkbox 58 is only applicable to the last point of an end condition. If checkbox 58 is checked, then the last segment of the end condition is considered to be of infinite length when solving the end condition. Checking box 58 on points in the end condition that are not the last point has no effect. Checkboxes 59-61 are also provided for check for interception, place point at interception, and do not construct functions, respectively. If box 59 for check interception is checked, the preceding line segment is checked for interception of the target when the end condition is solved. If box 59 is unchecked, this line segment is ignored when checking for interceptions. If the place point at interception box 60 is checked and an interception is found along the preceding line segment when it is solved, that line segment is drawn to the interception. Otherwise, if the interception is found, that line segment is drawn to its maximum width defined by field 54.

Sometimes it may be desirable to find a solution of an end condition but not draw all the line segments used to get to that solution. If the do not construct box 61 is checked, the point is solved like all other points in the end condition, but this point is skipped when the component line segments are drawn. The user can continue to place additional points using the mouse and fill out the dialogue boxes 52 to define end conditions. There may be no limitation to the number of end condition components that may start at any particular point. Additionally, end conditions at the same point may have the same priority so long as the end conditions do not both have a solution for a particular situation.

Figure 6:
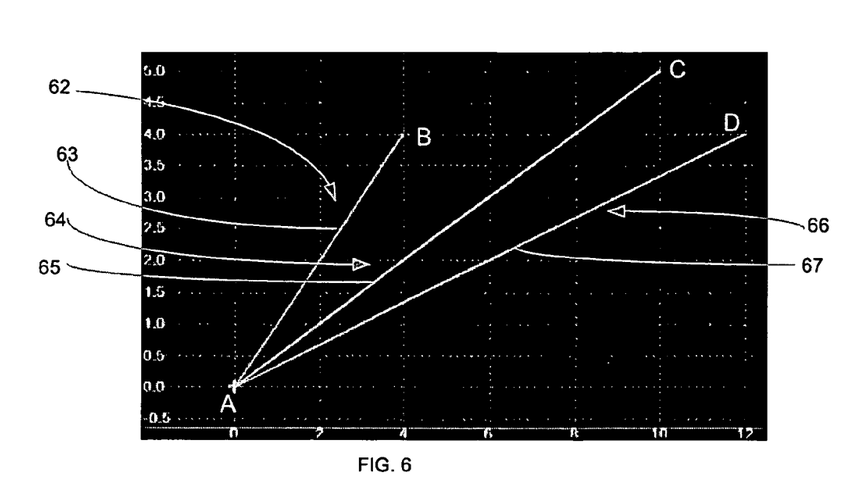
FIG. 6 depicts a graphical user interface for displaying end conditions according to an exemplary embodiment of the present invention.

FIG. 6 illustrates an example of three end conditions that start from a single point. Each of the end conditions is represented by a line segment extending from point A at 0, 0. End condition 62 includes one component represented by line 63 between points A and B and is defined to have a priority of 1, a maximum width of 4, and a slope of 100%. End condition 64 includes one component represented by line segment 65 between points A and C and is defined to have a priority of 2, a maximum width of 10, and a slope of 50%. End condition 66 includes one component represented by line segment 67 between points A and C and is defined to have a priority of 3, a slope of 33%, and an infinite width. Each of the end conditions 62, 64, 66 is defined as having a surface as their target type. Also, the checkboxes 59, 60 for check for interception and place point at interception have been checked for each of the line segments 63, 65, 67.

An end condition component can be placed at the end of another end condition component. In this situation, the end condition components are said to create a chain. A chain of end condition components is valid only if the entire chain is valid. In solving a chain of end conditions, a solution for the first component of the chain is found. All of the end condition components that are attached to the end of the first component are moved to the new end of the first component as determined by the solution. Then, the one or more end condition components that make up the second portion of the chain are solved. This continues until there are no more parts to the chain or until an end condition solution cannot be found for a particular part of the chain. If a solution is found for all parts of the chain, then the chain is valid. Otherwise, if any part of the chain is invalid, then the whole chain is invalid. There may be no limitation on the number of end condition components that may be chained together. Furthermore, it may be possible to create branching end conditions at any point in the chain.

Figure 7:
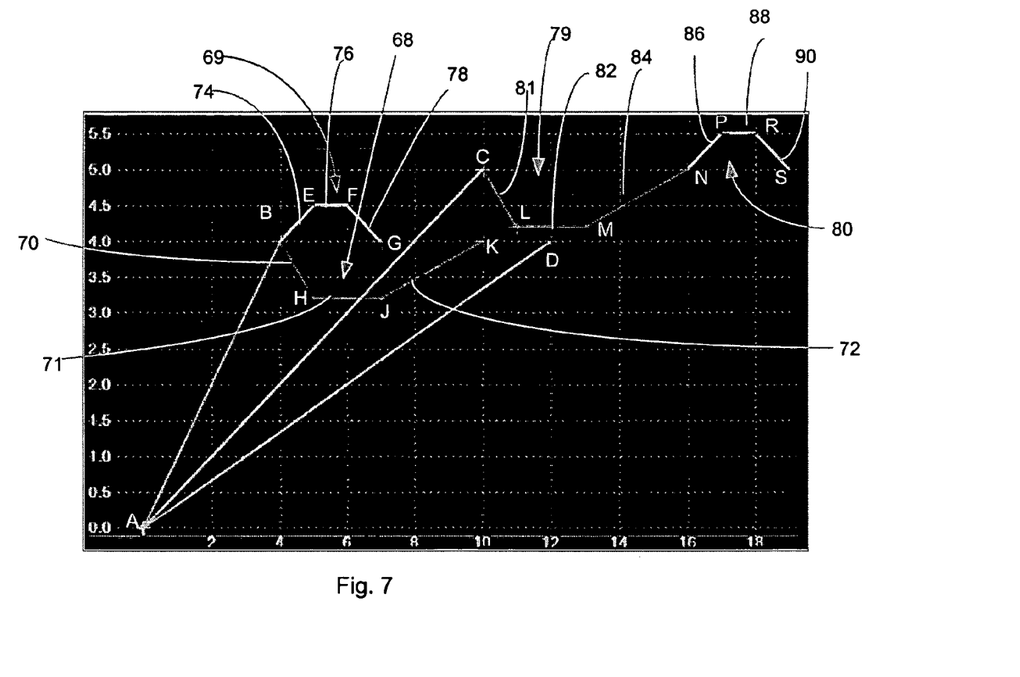
FIG. 7 depicts a graphical user interface for displaying end conditions according to an exemplary embodiment of the present invention.

FIG. 7 illustrates some examples of chained end condition components. In FIG. 7, the end conditions 62, 64, and 66 of FIG. 6 have been modified to include additional components. The first end condition 62 is modified to include branching components from point B at the end line segment 63. A ditch component 68 and a berm component 69 branch from point B. The ditch component 68 is defined with a feature XY target type with the feature being named "edge of ditch". The ditch component 68 includes three ditch line segments 70, 71, 72 that defined the ditch. The ditch line segments 70, 71, 72 may be created using the GUIs 22, 52 described above. The first ditch line segment 70 of the ditch extends downward from point B to point H. The second ditch line segment begins at point H, the end of the first ditch line segment 70 and extends to point J. A third ditch line segment 72 begins at point J and extend upward to point K. The ditch component 68 is attached end to end in a chain from the first component 63. Also, the checkboxes 59, 60 for check for interception and place point at interception have been checked for line segment 72.

The berm component 69 is defined with a feature XY target type with the feature named "edge of berm". The berm component is defined by three line segments 74, 76, 78. A first berm line segment 74 extends from point B at the end of line segment 63 to point E. Second berm line segment 76 begins at point E and extends to point F. Third berm line segment 78 begins at point F and extends to point G. The berm component is arranged end to end from the first component 63. Also, the checkboxes 59, 60 for check for interception and place point at interception have been checked for line segment 78.

In order for the first end condition 62 to have a valid solution, the sloping component 63, and either the ditch component 68 or the berm component 69 must have valid solutions.

Second end condition 64 is modified to comprise a chain of three components. Second end condition 64 includes the line segment 65, described above, that is set to seek a surface as a target type. A ditch component 79 and a berm component 80 are chained to line segment 65. The ditch component 79 includes three line segments 81, 82, 84 arranged end to end extending from the end of line segment 65. The ditch component has a feature XY target type with a target name of "edge of ditch". The first ditch line segment 81 of the ditch extends downward from point C to point L. The second ditch line segment 82 begins at point L, the end of the first ditch line segment 81, and extends to point M. A third ditch line segment 84 begins at point M and extend upward to point N. The ditch component is attached end to end in a chain from the first component 65. Also, the checkboxes 59, 60 for check for interception and place point at interception have been checked for line segment 84.

The berm component 80 includes three line segments 86, 88, 90 arranged end to end extending from the third line segment 84 of the ditch. The berm component has a feature XY target type with a target name "edge of berm". A first berm line segment 86 extends from point N at the end of line segment 84 to point P. Second berm line segment 88 begins at point P and extends to point R. Third berm line segment 90 begins at point R and extends to point S. The berm component is arranged end to end from the first component 63. Also, the checkboxes 59, 60 for check for interception and place point at interception have been checked for line segment 90.

In order for the second end condition 64 to have a valid solution, all three components, the sloping component 65, the ditch component 79, and the berm component 80 must have valid solutions. The third end condition 66 is not modified from FIG. 6.

Once the end conditions are defined, they may be solved and tested. FIG. 8 illustrates a flow diagram of an example of a method to solve end conditions. In block 100, the points in the design to be solved are determined. All points that represent the start of one or more end condition components, but that are not the end of an end condition are found. These are the points that are solved to determine if an end condition is valid. For a point to be included in the list of points that needs to be solved, the point must start at least one end condition component and it cannot be at the end of another end condition component. Thus, the solution for chained end conditions starts with the beginning of the chain.

An attempt is made to find a valid solution for each end condition at a point meeting the above requirements. The end conditions starting from a point to be solved are determined 102. The process starts with those end conditions with the highest priority and continues on to the lowest priority until a solution is found or all end condition components at that particular point have been tried, blocks 104, 106. If the current end condition is valid, the process proceeds to block 110, otherwise the process returns to block 104 to select the end condition with the next highest priority. If a valid solution is found, it is determined if there are additional components chained to the valid end condition, block 110. If so, the process returns to block 104 to solve the chained end conditions. Otherwise, the process proceeds to block 112 and the solved end condition is drawn. It is then determined, if there are remaining points to be solved, block 114. If there are no more points to solve, the process is complete, block 116. Otherwise, the process returns to block 102 and the process is repeated for each point in the list of end conditions to be solved.

Figure 9:
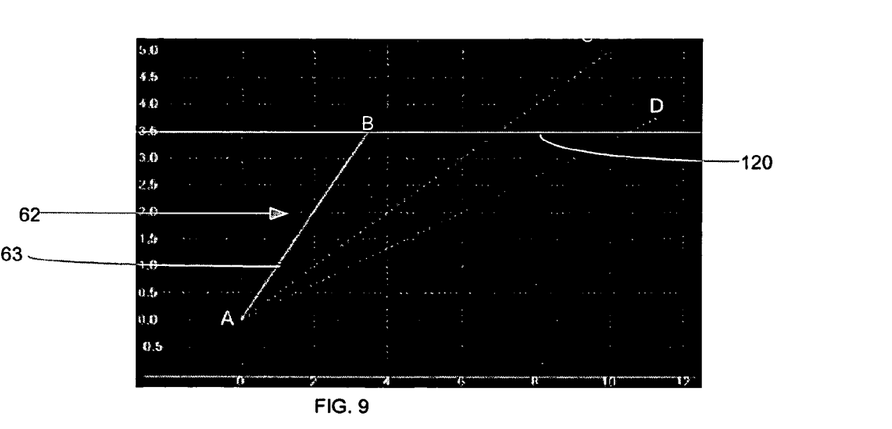
FIG. 9 depicts a graphical user interface for displaying end conditions according to an exemplary embodiment of the present invention.
Figure 10:
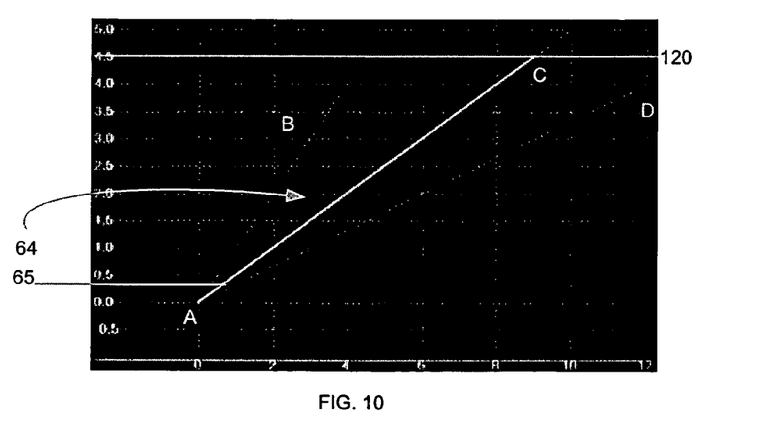
FIG. 10 depicts a graphical user interface for displaying end conditions according to an exemplary embodiment of the present invention.

Referring now to FIGS. 9-10, a simple example of a process for solving end conditions is described with reference to the first, second, and third end conditions 62, 64, 66 shown in FIG. 6. Per block 100, those points that represent the start of an end condition, but that are not at the end of an end condition are found. There are four points A, B, C, D in the end conditions shown in FIG. 6. Line segment 63 extends between points A, B line segment 65 extends between points A, C and line segment 67 extends between points A, D. In this example, only point A meets the requirements to be solved. Recall that each of line segments 63, 65, 67 has a surface as its target type. In the example shown in FIG. 9, a target surface 120 is placed at an elevation 3.5 feet. For a surface target type, a solution is valid if intersects the component target surface. Recall that when the target type is a surface, the process searches for a surface that has the name specified by the target name. If there is no target name, then the active surface is searched for. The end conditions starting from point A are solved, starting with the highest priority. The first end condition 62 has a priority of 1 and is therefore the highest priority end condition. End condition 62 includes a line segment 63 extending from 0 to 4 feet. It thus intercepts the target surface at 3.5 feet. Therefore, a solution to this end component is found and it is valid, blocks 106, 108. The process then proceeds to block 110. There are no other end conditions forming a chain, so the valid end condition is drawn, per block 112. Since there are no other points to solve, the process is complete, blocks 114, 116.

The place point at interception box 59 was checked for the line segment 63 of first end condition 62. Therefore, since an interception is found along the line segment 63 where it intersects target surface 120, the line segment 63 is drawn to that interception. Thus, line segment 63 is not drawn to its maximum length of 4 feet, but only to 3.5 feet where it intercepts the surface 120, as shown in FIG. 9.

FIG. 10 illustrates an example of a solution to the end conditions of FIG. 6 when the target surface 120 is arranged at an elevation of 4.5 feet. As described above, it is determined that point A is the only point to be solved, blocks 100-102. The end condition with the highest priority that starts at point A, first end condition 62, is first attempted to be solved, blocks 104, 106. Since the first end condition 62 ends at an elevation 4 feet, it does not intersect the target surface 120 located at an elevation of 4.5 feet. Therefore, the first end condition is not valid, block 108. The process returns to block 104 and selects the end condition with the next highest priority, in this case, the second end condition 64 represented by line segment 65, and solves it, block 106. The second end condition extends to 5 feet and thus intersects the target surface 120. Therefore, a solution to end component 64 is found and it is valid, block 108. The process proceeds to block 110. There are no other end conditions forming a chain, so the valid end condition is drawn, per block 112. Since there are no other points to solve, the process is complete, blocks 114, 116. The solution is then drawn. As no other points remain to be solved, the process ends.

The place point at interception box 59 was checked for the line segment 65 of second end condition 64. Therefore, since an interception is found along the line segment 65 where it intersects surface 120, the line segment 65 is drawn to that interception. Thus, line segment 65 is not drawn to its maximum length of 5 feet, but only to 4.5 feet where it intercepts the surface 120, as shown in FIG. 10. The third condition is not solved as a valid end condition with a higher priority has been found.

Figure 11:
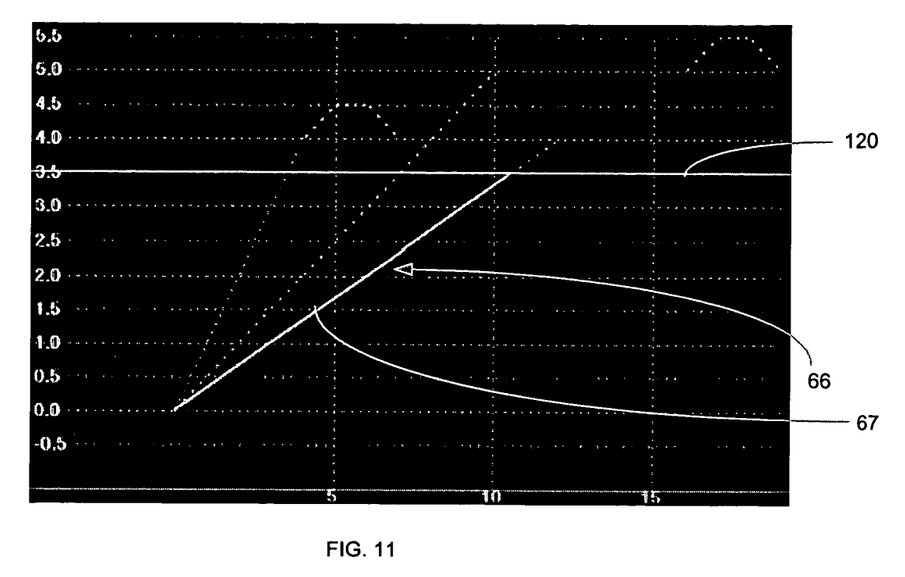
FIG. 11 depicts a graphical user interface for displaying end conditions according to an exemplary embodiment of the present invention.
Figure 12:
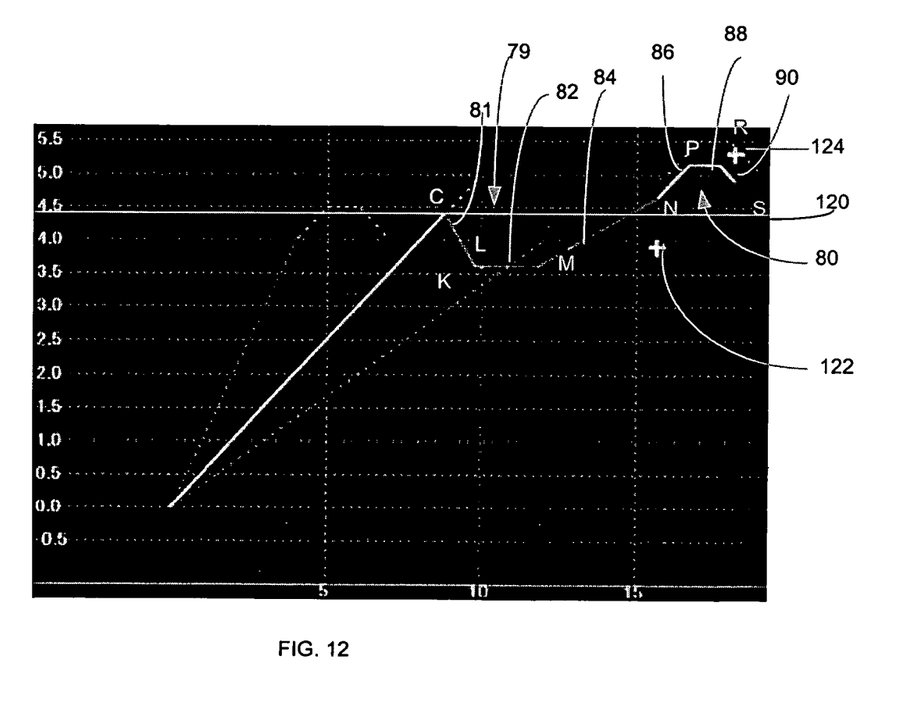
FIG. 12 depicts a graphical user interface for displaying end conditions according to an exemplary embodiment of the present invention.

FIGS. 11-12 illustrate examples of solutions for the chained end condition components shown in FIG. 7. There are sixteen points A-S in the design shown in FIG. 7. Per block 100, those points that represent the start of an end condition, but that are not at the end of an end condition are found. In this example, only point A meets this requirement. All of points B-S are at the end of an end condition. The end conditions starting at point A are solved starting with the highest priority end condition, blocks 102, 104. The first end condition 62 has a priority of one and is therefore solved first. In chained end condition 62, component 63 is the first end condition in the chain and is solved first, block 104. Recall that end condition 63 has a surface as its target type. Line segment 63 extends from 0 to 4 feet and thus intercepts the target surface 120 arranged at an elevation of 3.5 feet. The first end condition component 63 is therefore valid, block 106. It is then determined if another end condition is chained to component 63, block 110. Since, end conditions 68, 69 are present, the process proceeds back to block 104. In this example, the ditch component 68 and the berm component 69 have point B as their starting point. These components are then solved, blocks 104-108.

In the example shown in FIG. 11, only a surface target is available. The first end condition 69 requires an "edge of berm" feature and each condition 68 requires an "edge of ditch" feature as a targets. Since neither of the required targets is present, end conditions 68, 69 are not solved and the entire first end condition 62 is not valid. The process then moves to the end condition with the next highest priority, end condition 64, which has a priority of 2. The end condition 64 is then solved, blocks 104-108. End condition 64 requires both of an "edge of ditch" feature in component 79 and an "edge of berm" feature in component 80 as targets. Since neither of these targets is available, the second end condition 64 is not valid.

The process then moves to the end condition with the next highest priority, end condition 66. End condition 66 includes a single component 67. Line segment 67 has a surface as its target type. Line segment 67 intersects the surface 120 at 3.5 feet and is valid. Therefore, only end condition 66 has a solution and is valid. End condition 66 is then drawn. As there are no other starting points to be solved, the process ends at block 116.

FIG. 12 illustrates an example of the solution of the end conditions 62, 64, 66 in which an "edge of ditch" target and an "edge of berm" target are present along with target surface 120. In this example, the target surface is placed at 4.5 feet. The edge of ditch target is represented by the X 122 and the edge of berm target is represented by the X 124. For the feature XY target type, a solution to the end component is found if it intersects a vertical plane defined by the offset of the surface feature specified by the target name.

Starting from point A, the end condition with the highest priority is first attempted to be solved. Again, that is end condition 62. The first component of end condition 62 is sloping line segment 63. The end condition component 63 has a surface as its target type. The surface target 120 in this example is arranged at an elevation of 4.5 feet. The end condition 63 component ends at 4.0 feet and does not intercept this surface. Therefore, the entire first end condition 62 is not valid. The process proceeds to solve the end condition with the next highest priority, end condition 64. The first component of end condition 64 is sloping line segment 65. Sloping line segment 65 extends to point C at an elevation of 5 feet and has a surface as its target type. End condition component 65 intercepts the surface target 120 at an elevation of 4.5 feet. Therefore, end condition component 65 is valid. Note that since the place point at interception box was selected when creating this end condition, the next end condition is placed at 4.5 feet.

The process then proceeds to solve the second component 79 in the second end condition 64. The second component 79 is a ditch defined by line segments 81, 82, 84. The ditch has a target type of feature XY defined to search for the "edge of ditch" feature. As mentioned above, a solution is found if this end condition intercepts a vertical plane defined by the feature specified by the target name. Line segment 84 of the ditch feature intercepts the vertical plane extending through the X 122. Consequently, the edge of ditch target is in a valid location for the ditch component 79 and the ditch component is solved.

The process then moves to the third component of the second end condition 64, a berm component 80. The berm component 80 is represented by line segments 86, 88, 90. The berm component has a feature XY target type with a target name "edge of berm" 124. Line segment 90 of the berm component 80 intercepts a line defining the vertical plane extending through X 124. Therefore, the edge of berm target is in a valid location and the berm component 80 is valid. As each of the three end condition components, the sloping component 65, the ditch component 79 and the berm component 80, comprising the end condition 64 are valid, the end condition 64 chain is valid. The end condition 64 is then drawn. As there are no other points that need to be solved, the process is complete.

Figure 13:
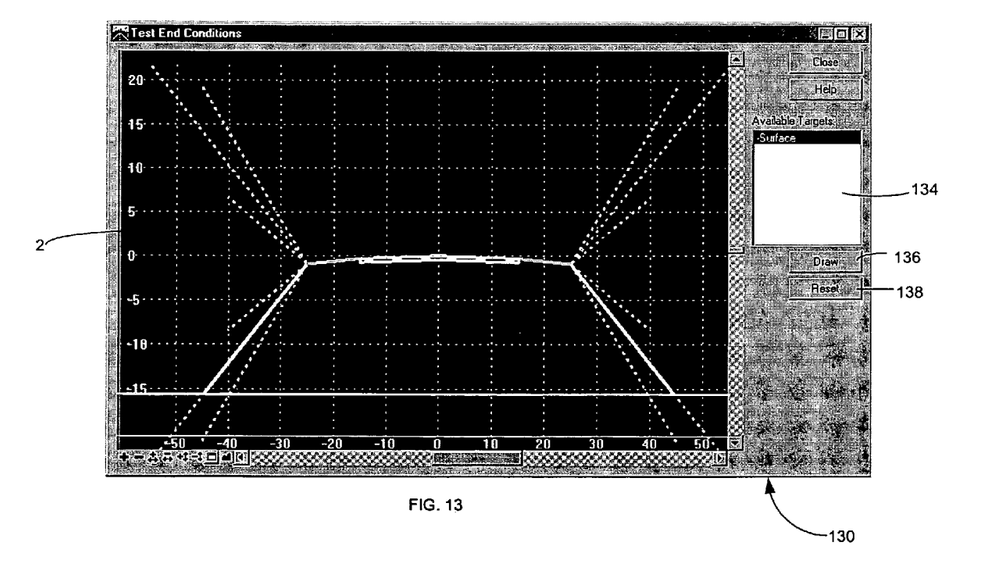
FIG. 13 depicts a graphical user interface for testing end conditions according to an exemplary embodiment of the present invention.

As can be seen from the above examples, which end conditions are valid will depend on which targets are available and the location of those targets. A designer may be provided with a process to test the end conditions that he created based on different locations of the targets. The designer can select different targets and place them in different locations. This allows the designer to determine if the end conditions are behaving as expected. As shown in FIG. 13, GUI 130 may be presented to a user in order to allow the user to test end conditions. GUI 130 includes a display portion 132 that displays the current template. Non-solved end conditions and their child components are displayed in dashed lines. Normal components and solved end conditions are displayed as solid lines. GUI 130 also includes a field 134 for displaying available targets. Buttons 136 and 138 for respectively drawing and resetting the available targets as described below are also provided.

In order to test the end conditions shown in the display portion 132, a target is selected from the available targets displayed in field 134. This maybe done using an input device such as a computer mouse, to position a cursor over the desired target. The mouse is then clicked to select that target. The target may be highlighted in field 134 after it is selected. The user then selects the draw button 136 in order to draw the selected target in the display portion 132. Once the draw button 136 is pressed, a representation of the selected target is drawn in the display portion 132. In the example shown, a surface is selected from field 134 as the target. A line 140 is drawn in the display portion 132 to represent the target surface. The target maybe moved to different positions within the display portion 132 to represent different existing conditions. For example, the surface can be placed at elevations of negative 15 feet, 0 feet, 5 feet, etc. The user can use their computer mouse to vary the location of the target.

Once a target is selected and placed, the end conditions can be tested. The end conditions are solved to determine a valid solution based on the location of the target. Solved end conditions are displayed as a solid line. As the target is moved within the display portion, the end conditions may dynamically solved and the display portion automatically updated to reflect the solution. Thus, as line 140 representing the surface target is moved to different elevations, the end condition that is currently valid based on the current location of the target is determined and displayed. Additional end conditions can be selected from field 134 and drawn in the display portion 132. The reset button 138 is provided to clear all of the targets from the display portion. The user can then test another scenario.

The embodiments illustrated and discussed in this specification are intended only to teach those skilled in the art the best way known to the inventors to make and use the invention. Nothing in this specification should be considered as limiting the scope of the present invention. The above-described embodiments of the invention may be modified or varied, and elements added or omitted, without departing from the invention, as appreciated by those skilled in the art in light of the above teachings. For example, the order in which the steps are performed may be varied as long as the above-described dependencies are maintained. It is therefore to be understood that, within the scope of the claims and their equivalents, the invention may be practiced otherwise than as specifically described.

What is claimed is:

1. A method, comprising:
graphically displaying at least one end condition;
receiving user input placing a target at a location;
receiving user input moving the location of the target;
determining a target type of the end condition using a computer device;
dynamically solving the at least one end condition based on the current location of the target; and
dynamically modifying the display to reflect valid end conditions determine to when the end condition is valid.

2. The method of claim 1, further comprising graphically displaying valid end conditions.

3. The method of claim 1, further comprising:
presenting a graphical user interface (GUI), the GUI including a graphics portion;
displaying a template and the at least one end conditions graphically in the graphics portion;
displaying available targets in the current template; and
displaying the invalid end conditions differently from valid end conditions.

4. A method comprising:
receiving user input placing a target at a location;
determining targets for a plurality of end conditions using a computer device;
displaying the targets to a user;
receiving user input selecting one of the targets;
receiving user input moving the location of the target;
dynamically solving the plurality of end conditions based on the current location of the target; and
dynamically modifying the display to reflect valid end conditions.

5. The method of claim 4, further comprising:
determining a valid solution to each of the plurality of the end conditions based on the targets and locations.

6. The method of claim 5, further comprising tracking the locations of the targets with the pointer.

7. A method, comprising:
receiving user input defining properties of an end condition;
receiving user input placing a target at a location;
receiving user input moving the location of the target using a computer device;
dynamically solving the at least one end condition based on the current location of a target;
dynamically modifying the display to reflect valid end conditions determine to when the end condition is valid; and
causing the end condition to be graphically displayed.

8. The method of claim 7, further comprising presenting a graphical user interface to a user.

9. The method of claim 7, wherein the properties include at least one of a priority, a target type, a target name, an offset, and benching information.

10. The method of claim 9, wherein the target type includes at least one of a surface, a material, an elevation, a vertical plane, a horizontal plane, and a point.

11. The method of claim 10, wherein the horizontal plane is one of a feature and an alignment.

12. The method of claim 10, wherein the vertical plane is one of a feature and an alignment.

13. The method of claim 7, further comprising:
locating a point within a template that represents a beginning of the end condition;
solving the end conditions that begin at the point;
displaying the end condition that has a valid solution.

14. The method of claim 7, further comprising:
solving the end condition starting with a highest priority and proceeding to a lowest priority.

15. The method of claim 7, further comprising chaining a second end condition to the end condition.

16. The method of claim 15, further comprising:
determining a solution to the second end condition; and
validating the solution only when all end conditions in the chain have valid solutions.

17. A method, comprising:
presenting a graphical user interface (GUI), the GUI including a graphics portion;
displaying a template and a plurality of end conditions graphically in the graphics portion;
displaying available targets in the current template;
determining a target type of the end condition using a computer device;
determining a location of a targets;
determining when the end condition is valid for the targets; and
displaying valid end conditions differently from not valid end conditions.

* * * * *